United States Patent
Kimura (10) Patent No.: US 11,037,858 B2
(45) Date of Patent: Jun. 15, 2021

(54) SEMICONDUCTOR MODULE, METHOD FOR MANUFACTURING THE SAME, AND POWER CONVERSION DEVICE

(71) Applicant: Mitsubishi Electric Corporation, Tokyo (JP)

(72) Inventor: Yoshitaka Kimura, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 47 days.

(21) Appl. No.: 16/454,470

(22) Filed: Jun. 27, 2019

(65) Prior Publication Data

US 2020/0211921 A1   Jul. 2, 2020

(30) Foreign Application Priority Data

Dec. 26, 2018   (JP) .............................. JP2018-243116

(51) Int. Cl.
| | |
|---|---|
| *H01L 23/373* | (2006.01) |
| *H02M 7/5387* | (2007.01) |
| *H01L 21/54* | (2006.01) |
| *H01L 21/52* | (2006.01) |
| *H01L 21/56* | (2006.01) |

(52) U.S. Cl.
CPC .......... *H01L 23/3737* (2013.01); *H01L 21/52* (2013.01); *H01L 21/54* (2013.01); *H01L 21/565* (2013.01); *H02M 7/53871* (2013.01)

(58) Field of Classification Search
CPC ....................... H01L 23/3737; H02M 7/53871
See application file for complete search history.

(56) References Cited

U.S. PATENT DOCUMENTS

| | | | | | |
|---|---|---|---|---|---|
| 4,987,474 | A | * | 1/1991 | Yasuhara | ............ H01L 23/4951 174/536 |
| 6,166,433 | A | * | 12/2000 | Takashima | .............. H01L 23/29 257/702 |
| 6,803,606 | B2 | * | 10/2004 | Takenaka | ................ H01L 33/56 257/103 |
| 7,425,727 | B2 | * | 9/2008 | Shoji | ..................... H01L 21/565 257/82 |
| 9,161,473 | B2 | * | 10/2015 | Hayashi | ................ H01L 23/055 |
| 9,425,065 | B2 | * | 8/2016 | Otsuki | ............. H01L 23/49811 |
| 9,583,407 | B2 | * | 2/2017 | Yoshida | ................. H01L 24/83 |
| 10,211,122 | B2 | * | 2/2019 | Kato | ...................... H01L 25/07 |
| 10,622,521 | B2 | * | 4/2020 | Nakabayashi | ........ H01L 33/486 |
| 2003/0213979 | A1 | * | 11/2003 | Nakajima | ......... H01L 23/49562 257/200 |
| 2004/0089928 | A1 | * | 5/2004 | Nakajima | ............. H01L 21/565 257/678 |
| 2007/0138624 | A1 | * | 6/2007 | Sudo | ................... H01L 23/3735 257/706 |

(Continued)

FOREIGN PATENT DOCUMENTS

JP    H10-270609 A    10/1998

*Primary Examiner* — Ida M Soward
(74) *Attorney, Agent, or Firm* — Studebaker & Brackett PC (57) ABSTRACT

A semiconductor module includes: a base plate; a semiconductor chip on the base plate; a case surrounding the semiconductor chip on the base plate, and sealing resin sealing the semiconductor chip inside the case, wherein a linear expansion coefficient of the sealing resin increases continuously from the semiconductor chip toward an upper surface of the sealing resin.

11 Claims, 7 Drawing Sheets

(56) References Cited

U.S. PATENT DOCUMENTS

| | | | | |
|---|---|---|---|---|
| 2015/0270473 A1* | 9/2015 | Uematsu | ............... | H01L 41/107 |
| | | | | 310/313 R |
| 2016/0131678 A1* | 5/2016 | Yaguchi | ............. | G01C 19/5783 |
| | | | | 73/511 |
| 2018/0226324 A1* | 8/2018 | Kimura | ................... | H01L 24/48 |
| 2019/0103334 A1* | 4/2019 | Tanaka | ................ | H01L 23/3675 |

* cited by examiner

SEMICONDUCTOR MODULE, METHOD FOR MANUFACTURING THE SAME, AND POWER CONVERSION DEVICE

BACKGROUND OF THE INVENTION

Field

The present invention relates to a semiconductor module, a method for manufacturing the same, and a power conversion device.

Background

Semiconductor modules used for the control of power are called "power modules" and carry a semiconductor chip such as an IGBT, MOSFET, FWDi and the like inside a case. In power modules, sealing resin is used for insulating semiconductor chips and wires from each other inside the case to enhance reliability.

Heat generated from the operating semiconductor chips is dissipated through the sealing resin. This results in a temperature distribution inside the sealing resin. Materials expand and contract with changes in temperature, i.e., each material has a linear expansion coefficient as its intrinsic physical property. The material having a large linear expansion coefficient deforms more easily with temperature changes, while the material having a small linear expansion coefficient is less deformable. A temperature difference between an upper part of the resin and the part surrounding the chip leads to a difference in the amount of deformation between the upper part and the lower part of the sealing resin, resulting in a larger deflection of the module. Japanese Patent Application Laid-open No. H10-270609 proposes a technique for providing two layers of sealing resin to make the linear expansion coefficient differ in the upper part and the lower part of the sealing resin.

SUMMARY

The sealing resin has a temperature profile that changes smoothly from the lower part to the upper part. Therefore, providing two layers of sealing resin could cause separation at the interface between the two layers and result in uneven deformation. Another proposed method involves changing the filler density of sealing resin continuously to change the linear expansion coefficient in a lateral direction in transfer molding of full-molded packages. However, the amounts of deformations in an upper part and a lower part of sealing resin cannot be matched with each other by changing the linear expansion coefficient in a lateral direction. Thus deflection of modules caused by a temperature distribution in the sealing resin could not be reduced by these methods.

The present invention was made to solve the problems described above and its object is to provide a semiconductor module that can reduce deflection of the module, a method for manufacturing the same, and a power conversion device.

A semiconductor module according to the present invention includes: a base plate; a semiconductor chip on the base plate; a case surrounding the semiconductor chip on the base plate, and sealing resin sealing the semiconductor chip inside the case, wherein a linear expansion coefficient of the sealing resin increases continuously from the semiconductor chip toward an upper surface of the sealing resin.

In the present, the linear expansion coefficient of the sealing resin increases continuously from the semiconductor chip toward the upper surface of the sealing resin. This way, the amounts of deformations in an upper part and a lower part of the sealing resin during the operation of the module can be matched with each other, so that deflection of the module can be reduced even if a large temperature distribution is generated in the sealing resin.

Other and further objects, features and advantages of the invention will appear more fully from the following description.

DESCRIPTION OF EMBODIMENTS

A semiconductor module, a method for manufacturing the same, and a power conversion device. according to the embodiments of the present invention will be described with reference to the drawings. The same components will be denoted by the same symbols, and the repeated description thereof may be omitted.

First Embodiment

Figure 1:
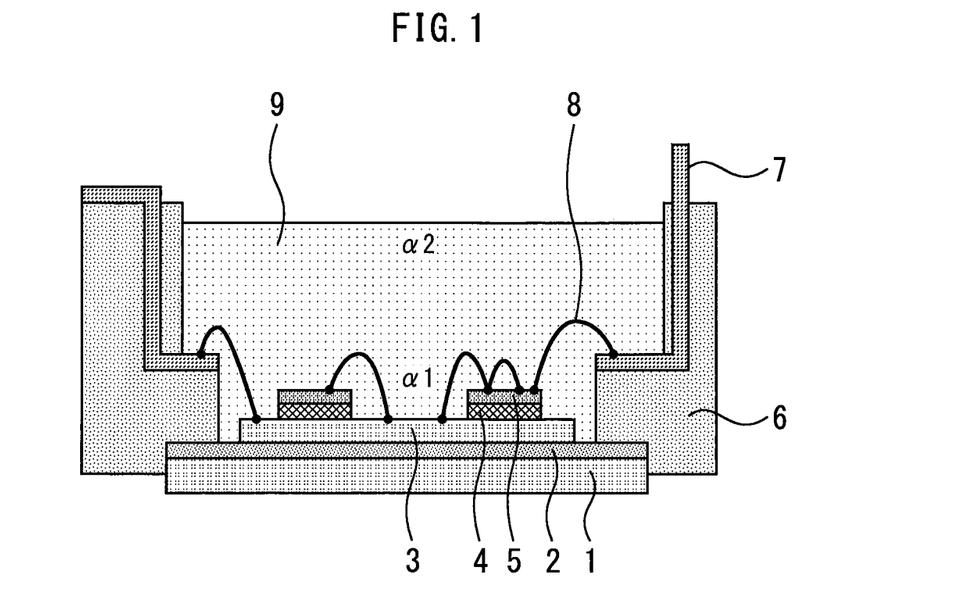
FIG. 1 is a cross-sectional view illustrating a semiconductor module according to a first embodiment.

FIG. 1 is a cross-sectional view illustrating a semiconductor module according to a first embodiment. An insulating substrate 2 and an electrode 3 are provided successively on a base plate 1. Semiconductor chips 5 are mounted on the electrode 3 via solder 4. A case 6 surrounds the semiconductor chips 5 on the base plate 1. An upper electrode of the semiconductor chip 5 is connected to a terminal 7 of the case 6 with a wire 8. Sealing resin 9 seals the semiconductor chips 5 and others inside the case 6.

The linear expansion coefficient of the sealing resin 9 increases continuously from the semiconductor chips 5 toward the upper surface of the sealing resin 9. The linear expansion coefficient α1 of the sealing resin 9 in the vicinity of the semiconductor chips 5 is lower than the linear expansion coefficient α2 near the upper surface of the sealing resin 9 (α1<α2).

The linear expansion coefficient α1 is around $2.0 \times 10^{-6}$ [/° C.] that is the linear expansion coefficient of Si composing the semiconductor chips 5. If the linear expansion coefficient α1 equals to that of the base plate 1, separation at the interface between the sealing resin 9 and the base plate 1 can be prevented. Cu, which is the material of the base plate 1, has a linear expansion coefficient of $16 \times 10^{-6}$ [/° C.]. The linear expansion coefficient α2, on the other hand, is around $30\times10^{-6}$ [/° C.], which is the sum of the linear expansion coefficient $23\times10^{-6}$ [/° C.] of Al that is the material of the wire 8 plus a margin. The linear expansion coefficient α2 should not exceed the highest one of linear expansion coefficients of the constituent components of the module.

When the semiconductor chips 5 operate, the temperature T1 around the semiconductor chips 5 becomes higher than the temperature T2 near the upper surface of the sealing resin 9 (T1>T2). Therefore, the amount of deformation α1*T1 of the sealing resin 9 near the semiconductor chips 5 becomes equal to the amount of deformation α2*T2 of the sealing resin 9 near the upper surface (α1*T1=α2*T2) in a range of temperature in actual use (Tjop to Tjmax).

As described above, in this embodiment, the linear expansion coefficient of the sealing resin 9 increases continuously from the semiconductor chips 5 toward the upper surface of the sealing resin 9. This way, the amounts of deformations in an upper part and a lower part of the sealing resin 9 during the operation of the module can be matched with each other, so that deflection of the module can be reduced even if a large temperature distribution is generated in the sealing resin 9. Accordingly, lifting-up of the module from a heat sink, which will increase thermal resistance, can be prevented.

Figure 2:
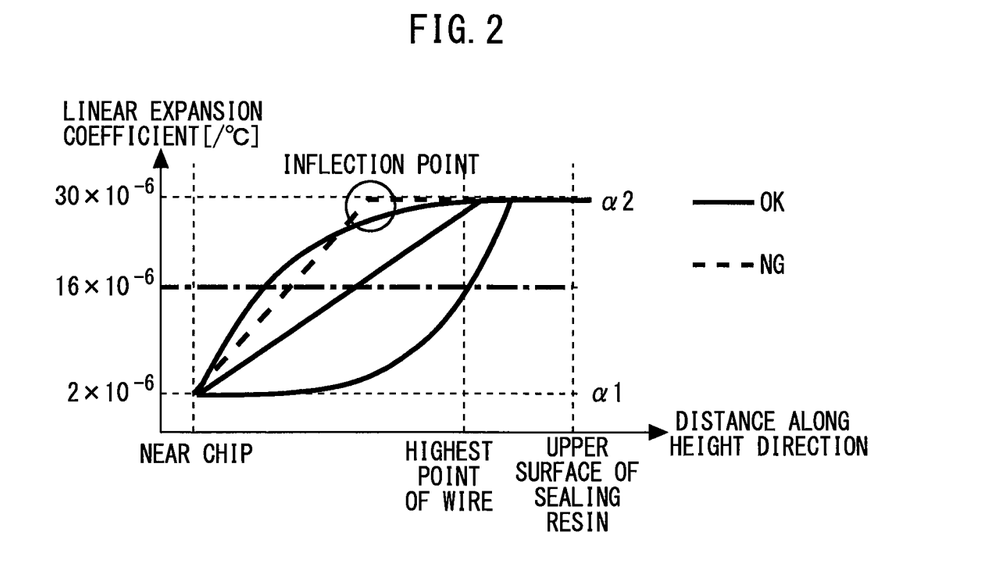
FIG. 2 is a graph showing changes in the linear expansion coefficient along a height direction of the sealing resin.

FIG. 2 is a graph showing changes in the linear expansion coefficient along a height direction of the sealing resin. The linear expansion coefficient of the sealing resin 9 changes along the height direction without an inflection point from the semiconductor chips 5 to a highest point of the wire 8. An inflection point is a point where the curve is not smooth and bends so that mathematically it cannot be differentiated. The linear expansion coefficient curve of the sealing resin 9 may have an inflection point above the wire 8.

Since the semiconductor chips 5, which are the source of heat, are disposed closely together near the base plate 1, the heat hardly changes in the lateral direction on the base plate 1. Therefore, the linear expansion coefficient of the sealing resin 9 should preferably not change in the lateral direction on the base plate 1. An attempt to cause the linear expansion coefficient of the sealing resin 9 to change in the lateral direction in this embodiment would adversely affect the productivity.

Second Embodiment

Figure 3:
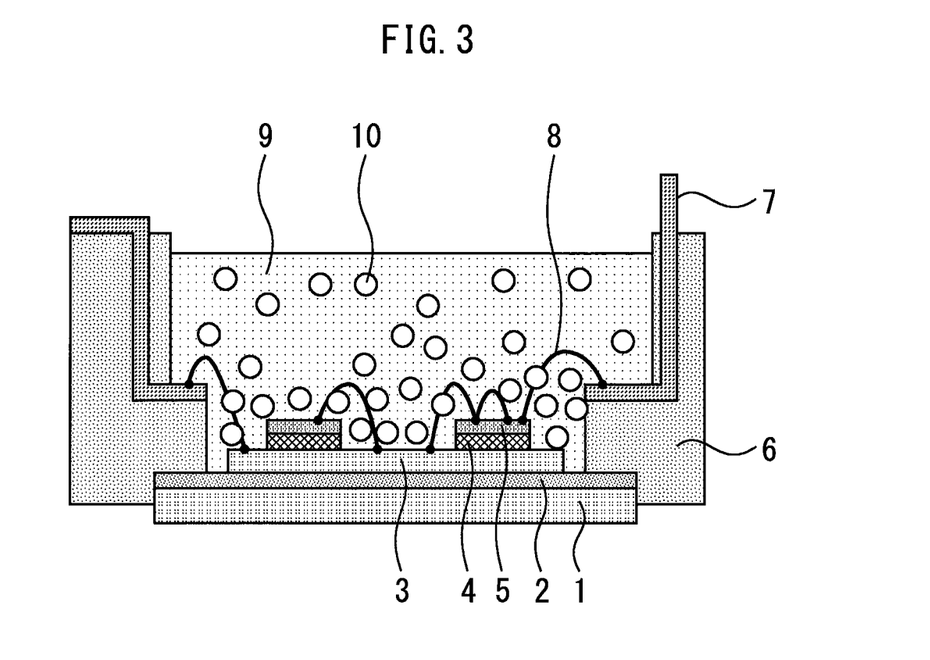
FIG. 3 is a cross-sectional view illustrating a semiconductor module according to a second embodiment.

FIG. 3 is a cross-sectional view illustrating a semiconductor module according to a second embodiment. Generally, fillers have a lower linear expansion coefficient than resin, which is the main component of the sealing resin. A sealing resin containing a high density of filler will have a low linear expansion coefficient and be harder to deform. On the other hand, a sealing resin having a low filler density will have a large linear expansion coefficient that is closer to that of the main component. In this embodiment, the density of filler 10 in the sealing resin 9 is decreased continuously from the semiconductor chips 5 toward the upper surface of the sealing resin 9. This way, the sealing resin 9 can have a distribution of linear expansion coefficient wherein the coefficient increases continuously from the semiconductor chips 5 toward the upper surface of the sealing resin 9.

Third Embodiment

Figure 4:
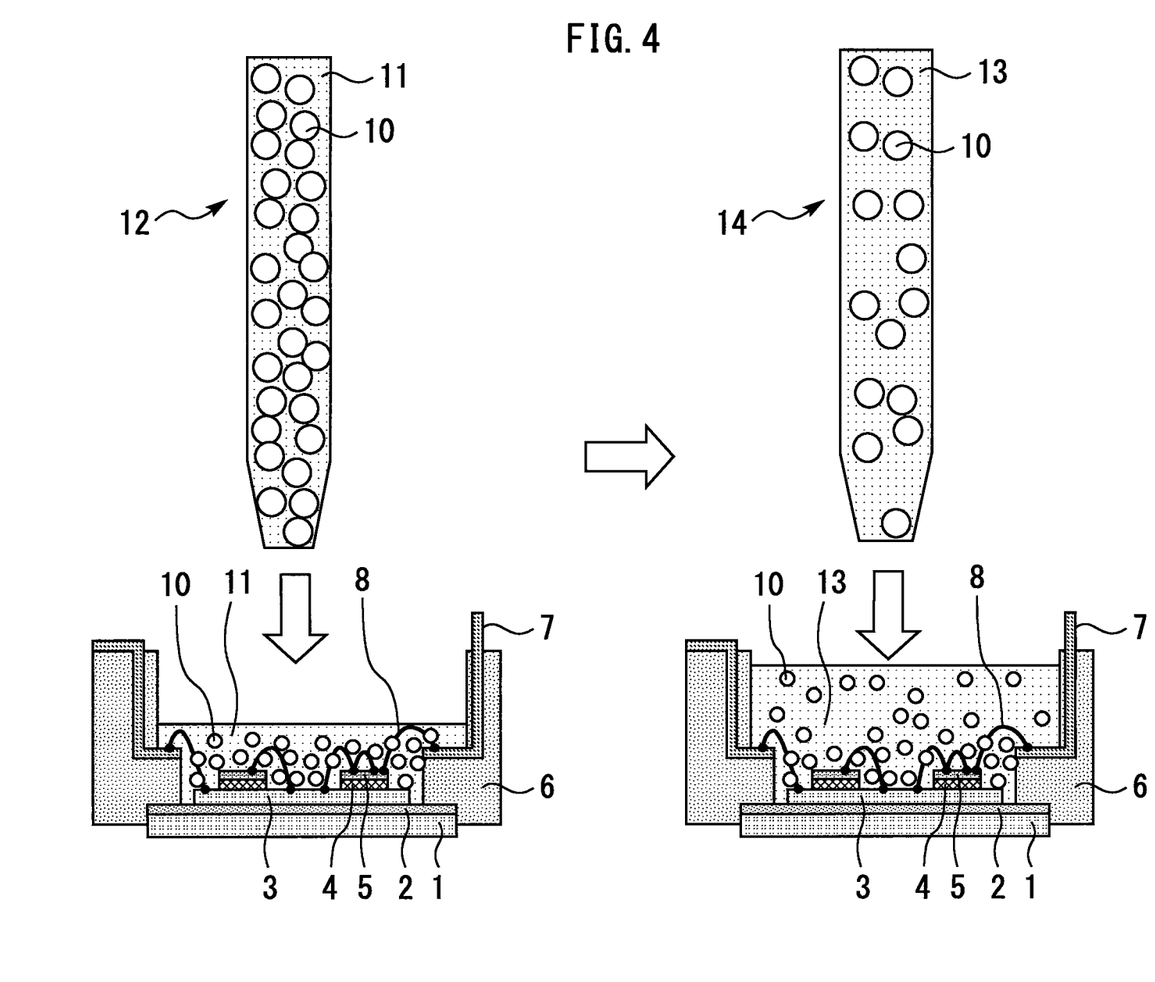
FIG. 4 is a cross-sectional view illustrating a method for manufacturing a semiconductor module according to a third embodiment.

FIG. 4 is a cross-sectional view illustrating a method for manufacturing a semiconductor module according to a third embodiment. A dispenser 12 for a first resin 11 in a liquid state with a high proportion of filler 10, and a dispenser 14 for a second resin 13 in a liquid state with a lower proportion of filler 10 than the first resin 11, are prepared. The first resin 11 is potted onto the base plate 1 and semiconductor chips 5. Next, the second resin 13 is potted onto the first resin 11. The first resin 11 and second resin 13, partly mixed together, are cured simultaneously, so as to form the sealing resin 9 having a continuously changing linear expansion coefficient. The semiconductor module according to the second embodiment is thus produced. As compared to transfer molding, the linear expansion coefficient of the sealing resin 9 can be changed gradually with this direct potting method by adjusting the curing conditions such as temperature, time, resin viscosity, and so on.

Fourth Embodiment

Figure 5:
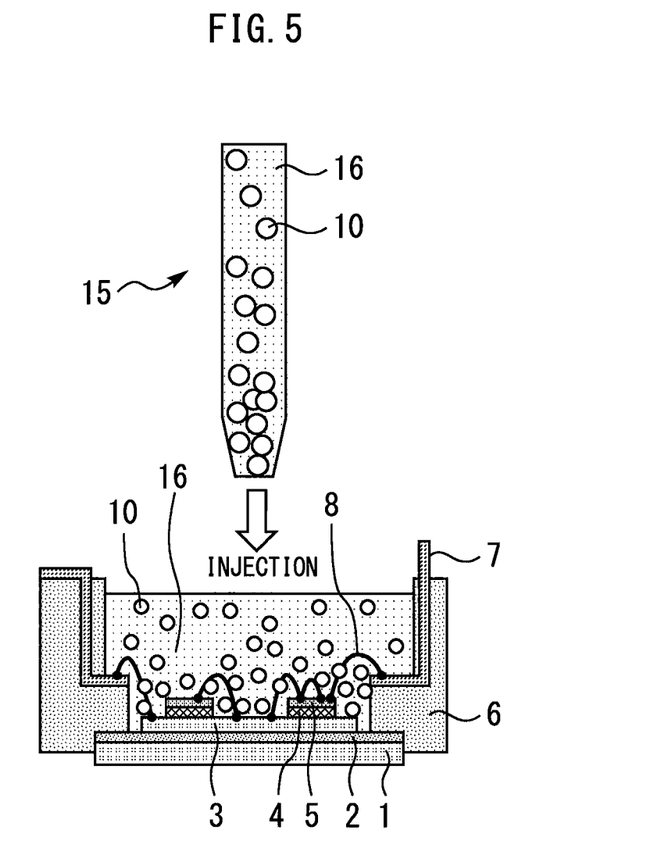
FIG. 5 is a cross-sectional view illustrating a method for manufacturing a semiconductor module according to a fourth embodiment.

FIG. 5 is a cross-sectional view illustrating a method for manufacturing a semiconductor module according to a fourth embodiment. Generally, the filler is distributed substantially evenly in the sealing resin, since the potting resin is cured before the filler settles inside the dispenser. In this embodiment, the filler 10 in the resin 16 is let settle inside the dispenser 15. The resin 16 is then potted onto the base plate 1 and semiconductor chips 5 from the lower end of the dispenser 15. The resin 16 is then cured to form the sealing resin 9. The semiconductor module according to the second embodiment is thus manufactured. While two dispensers are used in the third embodiment, the potting process can be completed in one step using one dispenser in this embodiment.

Fifth Embodiment

Figure 6:
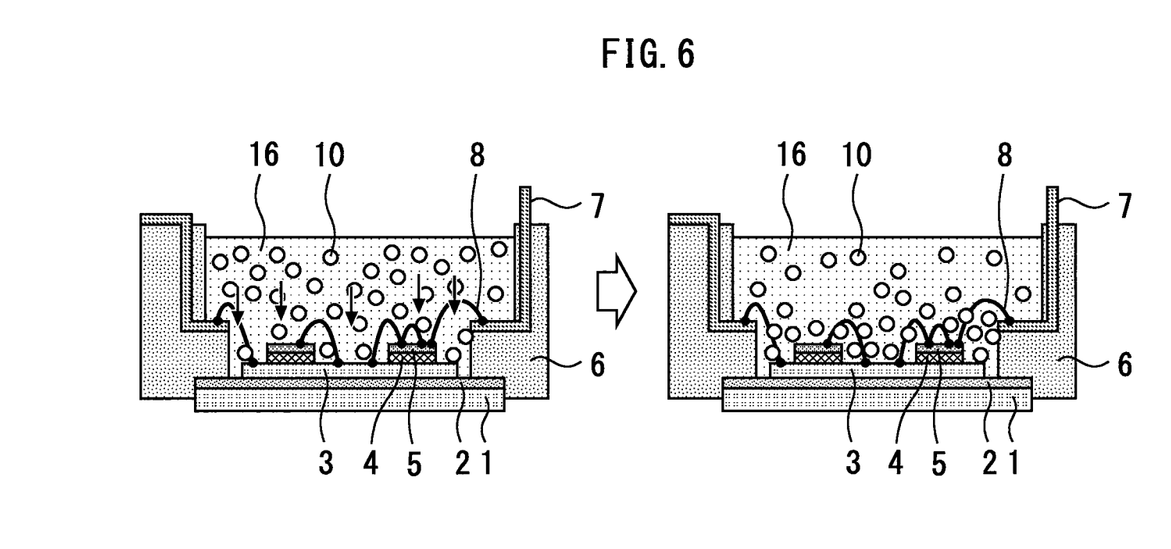
FIG. 6 is a cross-sectional view illustrating a method for manufacturing a semiconductor module according to a fifth embodiment.

FIG. 6 is a cross-sectional view illustrating a method for manufacturing a semiconductor module according to a fifth embodiment. In this embodiment, resin 16 in which the filler 10 is diffused uniformly, is potted onto the base plate 1 and semiconductor chips 5. Next, the resin 16 is let stand for a prescribed time intentionally to let the filler 10 settle. The resin 16 is cured after that to form the sealing resin 9. The semiconductor module according to the second embodiment is thus produced. The filler distribution curve is smoother according to this embodiment than the third and fourth embodiments, meaning that the amount of deformation during operation can be evened out more. Conditions such as curing temperature, time, resin viscosity and so on will have to be set suitably for letting the filler 10 settle as intentioned. The time it takes for the filler to settle can be controlled by lowering the viscosity of the main component of epoxy resin, for example.

Sixth Embodiment

Figure 7:
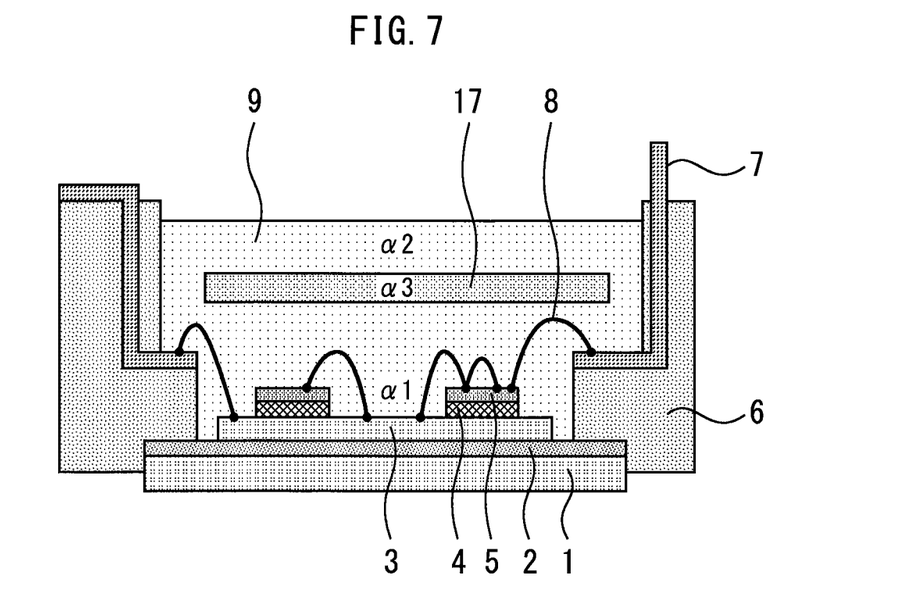
FIG. 7 is a cross-sectional view illustrating a semiconductor module according to a sixth embodiment.

FIG. 7 is a cross-sectional view illustrating a semiconductor module according to a sixth embodiment. A plate member 17 is additionally provided in this embodiment, disposed above the semiconductor chips 5 and sealed with the sealing resin 9. The plate member 17 has a high rigidity, and has a linear expansion coefficient α3 that is lower than the linear expansion coefficients α1 and α2 of the sealing resin 9 (α1, α2>α3). The plate member 17 is an insulator. The plate member 17 may be a conductor such as a metal material, in which case it is insulated from, and not electrically connected to, the semiconductor chips 5. By providing the plate member 17, deformation of the module due to a temperature rise of the sealing resin 9 can be reduced. With the plate member 17 provided, module deformation can be mitigated even if the sealing resin 9 has a uniform linear expansion coefficient (α1=α2).

Seventh Embodiment

Figure 8:
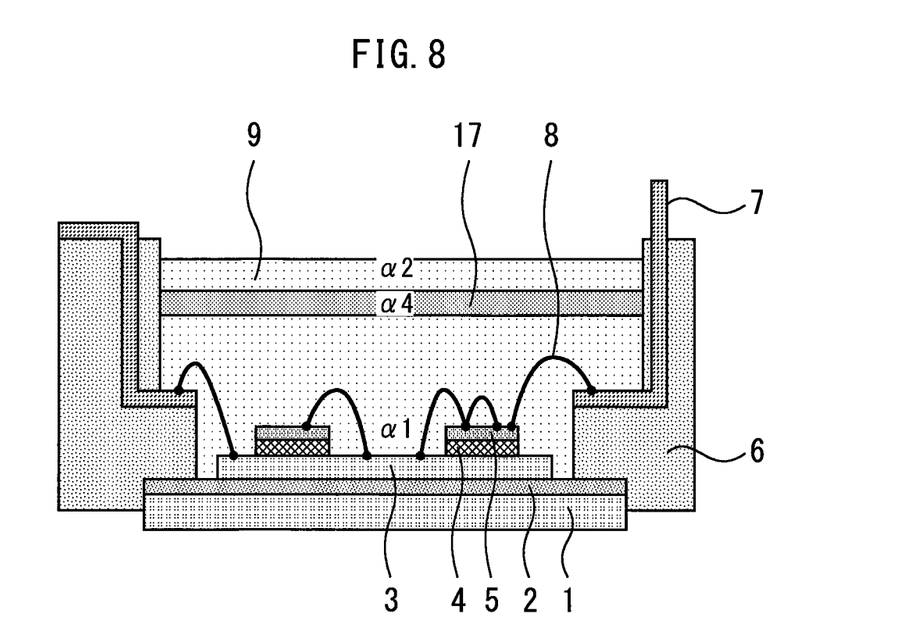
FIG. 8 is a cross-sectional view illustrating a semiconductor module according to a seventh embodiment.

FIG. 8 is a cross-sectional view illustrating a semiconductor module according to a seventh embodiment. The plate member 17 in this embodiment is provided as a beam structure that connects inner walls of the case 6. The plate member 17 is made of the same material as that of the case 6. Thus, the case 6 and the plate member 17 can be made of a single member. The material of the case 6 has a lower linear expansion coefficient α4 than the linear expansion coefficients α1 and α2 of the sealing resin 9 (α1, α2>α4). The plate member 17 need not necessarily be made of the same material as that of the case 6. Other configurations and effects are the same as those of the sixth embodiment.

The semiconductor chip 5 is not limited to a chip formed of silicon, but instead may be formed of a wide-bandgap semiconductor having a bandgap wider than that of silicon. The wide-bandgap semiconductor is, for example, a silicon carbide, a gallium-nitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor device in which the semiconductor chip is incorporated. Further, since the semiconductor chip has a high heat resistance, a radiation fin of a heatsink can be miniaturized and a water-cooled part can be air-cooled, which leads to further miniaturization of the semiconductor device. Further, since the semiconductor chip has a low power loss and a high efficiency, a highly efficient semiconductor device can be achieved. Since the semiconductor chip formed of the wide band gap semiconductor is used at a high temperature and the temperature in the vicinity of the semiconductor chip 5 further rises, first to seventh embodiments are particularly effective.

Eighth Embodiment

In this embodiment, the semiconductor modules according to the first to seventh embodiments described above are applied to an electric power conversion device. The electric power conversion device is, for example, an inverter device, a converter device, a servo amplifier, or a power supply unit. Although the present invention is not limited to a specific electric power conversion device, a case where the present invention is applied to a three-phase inverter will be described below.

Figure 9:
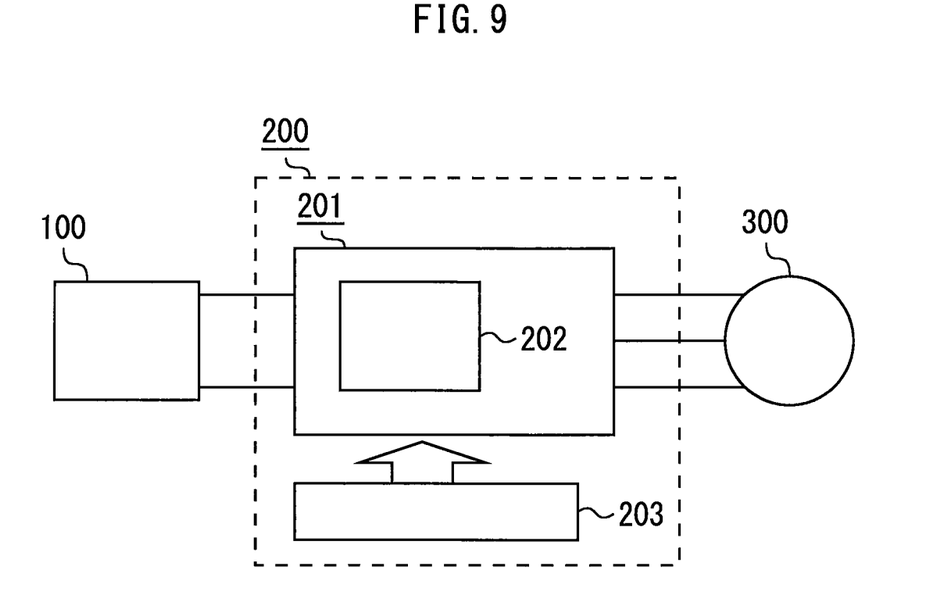
FIG. 9 is a block diagram illustrating a configuration of an electric power conversion system to which the electric power conversion device according to the eighth embodiment is applied.

FIG. 9 is a block diagram illustrating a configuration of an electric power conversion system to which the electric power conversion device according to the eighth embodiment is applied. This electric power conversion system includes a power supply 100, an electric power conversion device 200, and a load 300. The power supply 100 is a DC power supply and supplies DC power to the electric power conversion device 200. The power supply 100 can be composed of various components. For example, the power supply 100 can be composed of a DC system, a solar cell, or a storage battery, or may be composed of a rectifier or an AC/DC converter, which is connected to an AC system. Alternatively, the power supply 100 may be composed of a DC/DC converter that convers DC power output from a DC system to predetermined power.

The electric power conversion device 200 is a three-phase inverter connected to a node between the power supply 100 and the load 300, converts DC power supplied from the power supply 100 into AC power, and supplies the AC power to the load 300. The electric power conversion device 200 includes a main conversion circuit 201 that converts DC power into AC power and outputs the AC power, and a control circuit 203 that outputs a control signal for controlling the main conversion circuit 201 to the main conversion circuit 201.

The load 300 is a three-phase electric motor that is driven by AC power supplied from the electric power conversion device 200. The load 300 is not limited to a specific application. The load is used as an electric motor mounted on various electric devices, such as an electric motor for, for example, a hybrid vehicle, an electric vehicle, a railroad vehicle, an elevator, or an air-conditioner.

The electric power conversion device 200 will be described in detail below. The main conversion circuit 201 includes a switching device and a reflux diode (not illustrated). When the switching device is switched, the main conversion circuit 201 converts DC power supplied from the power supply 100 into AC power, and supplies the AC power to the load 300. The main conversion circuit 201 may have various types of specific circuit configurations. The main conversion circuit 201 according to this embodiment is a two-level three-phase full-bridge circuit, which can be composed of six switching devices and six reflux diodes connected in antiparallel with the respective switching devices. Each switching device and each reflux diode of the main conversion circuit 201 are composed of a semiconductor device 202 corresponding to any one of the first to fourth embodiments described above. Every two switching devices of the six switching devices are connected in series and constitute a vertical arm. Each vertical arm constitutes each phase (U-phase, V-phase, W-phase) of the full-bridge circuit. Output terminals of each vertical arm, i.e., three output terminals of the main conversion circuit 201, are connected to the load 300.

Further, the main conversion circuit 201 includes a drive circuit (not illustrated) that drives each switching device. The drive circuit may be incorporated in the semiconductor device 202. Another drive circuit different from the semiconductor device 202 may be provided. The drive circuit generates a drive signal for driving each switching device of the main conversion circuit 201, and supplies the generated drive signal to a control electrode of each switching device of the main conversion circuit 201. Specifically, the drive circuit outputs, to the control electrode of each switching device, a drive signal for turning on each switching device and a drive signal for turning off each switching device, according to the control signal output from the control circuit 203, which is described later. When the ON-state of each switching device is maintained, the drive signal is a voltage signal (ON signal) having a voltage equal to or higher than a threshold voltage of the switching device. When the OFF-state of each switching device is maintained, the drive signal is a voltage signal (OFF signal) having a voltage equal to or lower than the threshold voltage of the switching device.

The control circuit 203 controls each switching device of the main conversion circuit 201 so as to supply a desired power to the load 300. Specifically, the control circuit 203 calculates a period (ON period), in which each switching device of the main conversion circuit 201 is in the ON state, based on the power to be supplied to the load 300. For example, the main conversion circuit 201 can be controlled by a PWM control for modulating the ON period of each switching device depending on the voltage to be output. Further, the control circuit 203 outputs a control command (control signal) to the drive circuit included in the main conversion circuit 201 so that the ON signal is output to each switching device to be turned on and an OFF signal is output to each switching device to be turned off at each point. The drive circuit outputs the ON signal or OFF signal, as the drive signal, to the control electrode of each switching device according to the control signal.

In the electric power conversion device according to this embodiment, the semiconductor modules according to the first to seventh embodiments are applied as the semiconductor device 202. Accordingly, the resistance to deformation of the module is improved, and the reliability of the entire power conversion device is improved.

While this embodiment illustrates an example in which the present invention is applied to a two-level three-phase inverter, the present invention is not limited to this and can be applied to various electric power conversion devices. While this embodiment illustrates a two-level electric power conversion device, the present invention can also be applied to a three-level or multi-level electric power conversion device. When power is supplied to a single-phase load, the present invention may be applied to a single-phase inverter. The present invention can also be applied to a DC/DC converter or an AC/DC converter when power is supplied to a DC load or the like.

Further, in the electric power conversion device to which the present invention is applied, the above-mentioned load is not limited to an electric motor. For example, the load may also be used as a power supply device for an electric discharge machine, a laser beam machine, an induction heating cooker, or a non-contact device power feeding system. More alternatively, the electric power conversion device may be used as a power conditioner for a photovoltaic power generating system, an electricity storage system, or the like.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-243116, filed on Dec. 26, 2018 including specification, claims, drawings and summary, on which the Convention priority of the present application is based, is incorporated herein by reference in its entirety.

The invention claimed is:

1. A semiconductor module comprising:
a base plate;
a semiconductor chip on the base plate;
a case surrounding the semiconductor chip on the base plate, and
sealing resin sealing the semiconductor chip inside the case,
wherein a linear expansion coefficient of the sealing resin increases continuously from the semiconductor chip toward an upper surface of the sealing resin.

2. The semiconductor module according to claim 1, further comprising a wire connected to the semiconductor chip and sealed with the sealing resin, wherein the linear expansion coefficient of the sealing resin changes along a height direction without an inflection point from the semiconductor chip to a highest point of the wire.

3. The semiconductor module according to claim 1, wherein the linear expansion coefficient of the sealing resin does not change in a lateral direction on the base plate.

4. The semiconductor module according to claim 1, wherein a density of filler in the sealing resin is decreased continuously from the semiconductor chip toward the upper surface of the sealing resin.

5. The semiconductor module according to claim 1, further comprising a plate member sealed with the sealing resin and having a lower linear expansion coefficient than that of the sealing resin.

6. The semiconductor module according to claim 5, wherein the plate member is a beam structure that connects inner walls of the case.

7. The semiconductor module according to claim 1, wherein the semiconductor chip is formed from a wide-band-gap semiconductor.

8. A method for manufacturing the semiconductor module according to claim 4 comprising:
potting first resin with filler onto the base plate and semiconductor chip;
potting second resin with a lower proportion of filler than the first resin onto the first resin; and
simultaneously curing the first resin and second resin which are partly mixed together to form the sealing resin.

9. A method for manufacturing the semiconductor module according to claim 4 comprising:
letting filler settle in resin inside a dispenser and potting the resin onto the base plate and semiconductor chip from a lower end of the dispenser; and
curing the potted resin to form the sealing resin.

10. A method for manufacturing the semiconductor module according to claim 4 comprising:
potting resin in which filler is diffused onto the base plate and semiconductor chip; and
letting the filler settle in the potted resin and curing the resin to form the sealing resin.

11. A power conversion device comprising:
a main conversion circuit including the semiconductor module according to claim 1, converting input power and outputting converted power; and
a control circuit outputting a control signal for controlling the main conversion circuit to the main conversion circuit.

* * * * *